(12) United States Patent
Bez et al.

(10) Patent No.: US 6,222,245 B1
(45) Date of Patent: *Apr. 24, 2001

(54) HIGH CAPACITY CAPACITOR AND CORRESPONDING MANUFACTURING PROCESS

(75) Inventors: Roberto Bez, Milan; Emilio Camerlenghi, Bergamo, both of (IT)

(73) Assignee: SGS-Thomson Microelectronics S.r.l., Agrate Brianza (IT)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/739,997

(22) Filed: Oct. 30, 1996

(30) Foreign Application Priority Data

Oct. 31, 1995 (EP) .................................................. 95830459

(51) Int. Cl.$^7$ .............................. H01L 29/00; G05F 1/10; G05F 3/02; H02M 3/18
(52) U.S. Cl. .............................. 257/532; 327/536; 363/60
(58) Field of Search .................. 327/536; 257/532; 363/60; 438/396, 253

(56) References Cited

U.S. PATENT DOCUMENTS

| | | | |
|---|---|---|---|
| 4,211,941 | | 7/1980 | Schade, Jr. ............................. 307/303 |
| 4,527,180 | * | 7/1985 | Oto ......................................... 257/532 |
| 4,914,546 | * | 4/1990 | Alter ...................................... 361/313 |
| 5,014,097 | * | 5/1991 | Kazerounian et al. ............... 257/317 |
| 5,093,586 | * | 3/1992 | Asari ...................................... 327/530 |
| 5,544,102 | * | 8/1996 | Tobita et al. ......................... 365/189.09 |

FOREIGN PATENT DOCUMENTS

| | | | |
|---|---|---|---|
| 0 415 774 | 3/1991 | (EP) | .............................. H01L/29/94 |
| 0 540 948 | 5/1993 | (EP) | .............................. H02M/3/07 |

OTHER PUBLICATIONS

European Search Report from European Patent Application No. 95830459.4, filed Oct. 31, 1995.
Patent Abstracts of Japan, vol. 7, No. 102 (E–173) [1248], May 6, 1983 & JP–A–58 023470 (OKI Denki).

* cited by examiner

*Primary Examiner*—Brian Dutton
(74) *Attorney, Agent, or Firm*—Wolf, Greenfield & Sacks P.C.; James H. Morris; Theodore E. Galanthay

(57) ABSTRACT

The invention relates to a high-capacitance capacitor which is monolithically integratable on a semiconductor substrate doped with a first type of dopant and accommodating a diffusion well which is doped with a second type of dopant and has a first active region formed therein.

A layer of gate oxide is deposited over the diffusion well which is covered with a first layer of polycrystalline silicon and separated from a second layer of polycrystalline silicon by an interpoly dielectric layer.

Advantageously, the high-capacitance capacitor of the invention includes a first elementary capacitor having the first and second layers of polycrystalline silicon as its conductive plates, and the interpoly dielectric layer as the isolation dielectric, and a second elementary capacitor having the first layer of polycrystalline silicon and the diffusion well as its conductive plates and the gate oxide layer as the isolation dielectric.

13 Claims, 3 Drawing Sheets

US 6,222,245 B1

HIGH CAPACITY CAPACITOR AND CORRESPONDING MANUFACTURING PROCESS

BACKGROUND OF THE INVENTION

1. Field of the Invention

The present invention relates to a high-capacitance capacitor.

More particularly, the present invention relates to a high-capacitance capacitor which can be monolithically integrated on a semiconductor substrate doped with a first type of dopant, the substrate containing a diffusion well doped with a second type of dopant and formed with a first active region therein, and a gate oxide layer being deposited onto said diffusion well which is covered with a first layer of polycrystalline silicon and separated from a second layer of polycrystalline silicon by an interpoly dielectric layer.

The present invention further relates to a process for integrating a high-capacitance capacitor on a semiconductor substrate doped with a first type of dopant, which process includes the steps of defining a well doped with a second type of dopant, implanting and then diffusing a first defined region doped to a higher concentration of dopant of the second type, depositing a gate oxide layer over the diffusion well, covering said oxide layer with a first layer of polycrystalline silicon, and depositing a second dielectric layer referred to as the interpoly dielectric.

The present invention further relates, to a voltage step-up circuit for non-volatile semiconductor memories, the voltage step-up circuit including an integrated high-capacitance capacitor. The description which follows will make specific reference to this field of application for convenience of illustration.

2. Discussion of the Related Art

As is well known, there are many applications, involving electronic circuits integrated on a semiconductor, wherein higher voltages than a supply voltage Vcc need to be generated. Voltage step-up or "booster" circuits provide such higher voltages, even internally of the integrated circuit.

In particular, electrically programmable non-volatile memories, e.g., Flash EEPROM type memories, require a write voltage far above the conventional 5-volt supply. In programming integrated read-only memories of this kind, the individual storage cells must be applied a programming voltage Vp of relatively high value, close to about 12 volts. This programming voltage is usually generated inside the integrated circuit by means of a voltage-multiplying circuit or "booster".

A voltage-multiplying circuit is known, for example, from European Patent Application No. EP-A-0 540 948, published on May 12, 1993. The voltage multiplier described in that patent application is of a type known as "charge pump" and requires at least two capacitors. A first capacitor functions to draw and transfer electric charges from the input terminal of the multiplier to the output terminal. A second capacitor functions to store up the charges. A set of switches driven by respective signals that do not overlap in time, allow an output voltage Vout to be generated which is approximately twice as high as the supply voltage.

Generating this high programming voltage involves, however, the provision of large-size capacitors, normally outside the integrated circuit. The efficiency of a charge pump circuit is, in fact, proportional to the capacitive value of the capacitors used in the charge pump.

But increasing the capacitance of a capacitor requires increasing the area for it on the circuit, and hence increasing the physical size of the memory device which contains it. In addition, enlarging the plate area of a capacitor results in increased risk of breaks within the dielectric and makes its integration more difficult.

Alternatively, smaller capacitors connected in series or parallel configurations to provide an equivalent capacitor of greater overall capacitance could be used. However, the last-mentioned approach also implies increased area requirements to accommodate the aggregate capacitors, and hence a device of larger size.

In general, for all voltage booster circuits used in apparatus to which only a very low (up to 1 volt) DC supply voltage is available—e.g. many telecommunications line apparatus, portable appliances, etc.—there exists a demand for capacitors of high capacitance and reduced physical size.

The underlying technical problem of this invention is to provide a high-capacitance capacitor whereby the ratio of electric charge storage capacity to occupied area can be optimized, overcoming the drawbacks with which prior solutions are beset.

SUMMARY OF THE INVENTION

According to an embodiment of the invention, a high-capacitance capacitor utilizes the interpoly dielectric in a structure integrated on a semiconductor with a process of the MOS type.

One embodiment of the invention directed to a capacitor which includes first and second elementary capacitors formed from two layers of polycrystalline silicon deposited onto an active area of the integrated circuit and separated by an interpoly dielectric layer.

Another embodiment of the invention is directed to a fabrication process of the MOS type providing for a double deposition of polycrystalline silicon as previously indicated.

Another embodiment of the invention is directed to a voltage step-up circuit of the charge pump type which uses a high-capacitance capacitor.

The features and advantages of the invention will be apparent from the following detailed description which is given by way of non-limitative example with reference to the accompanying drawings.

DETAILED DESCRIPTION

Figure 1:
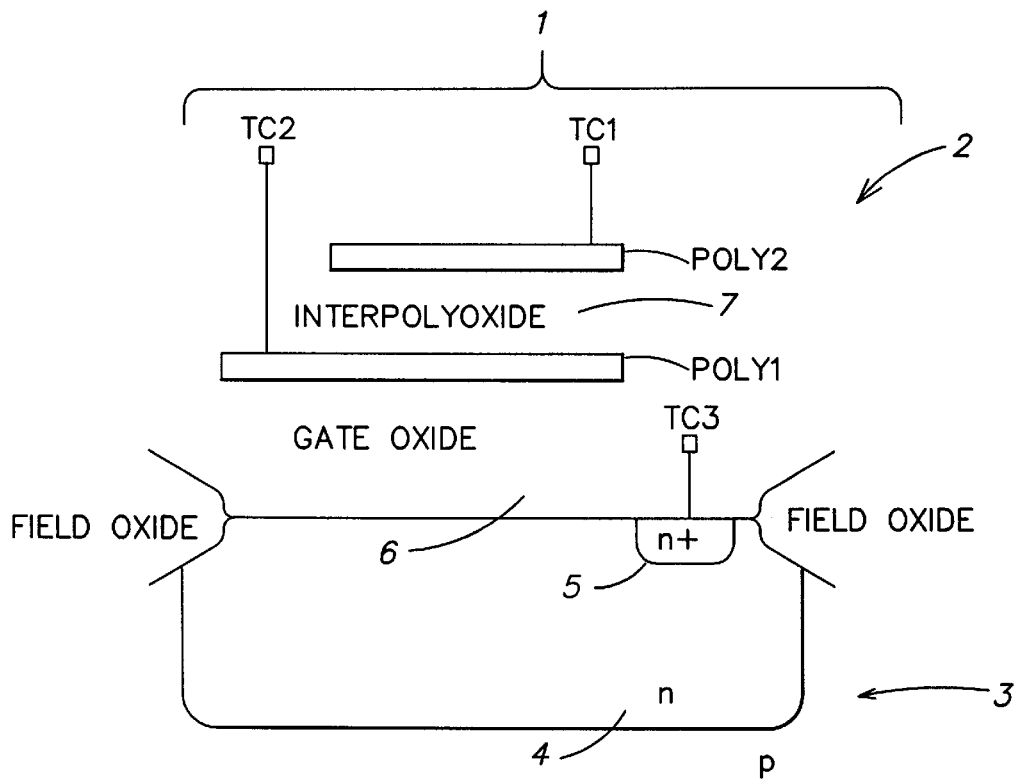
FIG. 1 shows a vertical cross-section view of a high-capacitance capacitor according to a first embodiment of the invention.

Referring to the drawing figures, generally shown at 1 is a high-capacitance capacitor according to the invention, as formed on an integrated structure 2 basically of a sandwich type.

The structure 2 includes a semiconductor substrate 3 doped with a first dopant, e.g. of the P type, wherein a diffusion well 4 has been formed which is doped with a second dopant of the N type.

It would be equally possible to use a semiconductor substrate 3 of the N type formed with a diffusion well 4 of the P type.

Provided inside the diffusion well 4, as by implanting and then diffusing a dopant, is a first diffused region 5 which has a concentration of the second dopant type N+ higher than that of the diffusion well 4. However, a diffused region 5 doped P+ could be provided instead.

Similarly, if the diffusion well 4 is P-doped, a diffused region 5 of either the N+ or P+ type may be formed.

An oxide layer 6, referred to as the gate oxide, is deposited over the diffusion well 4, and is covered with a first layer of polycrystalline silicon, POLY1.

A dielectric layer 7, known as the interpoly dielectric, is deposited onto the first layer POLY1, and is covered with a second layer of polycrystalline silicon, POLY2.

Figure 1A:
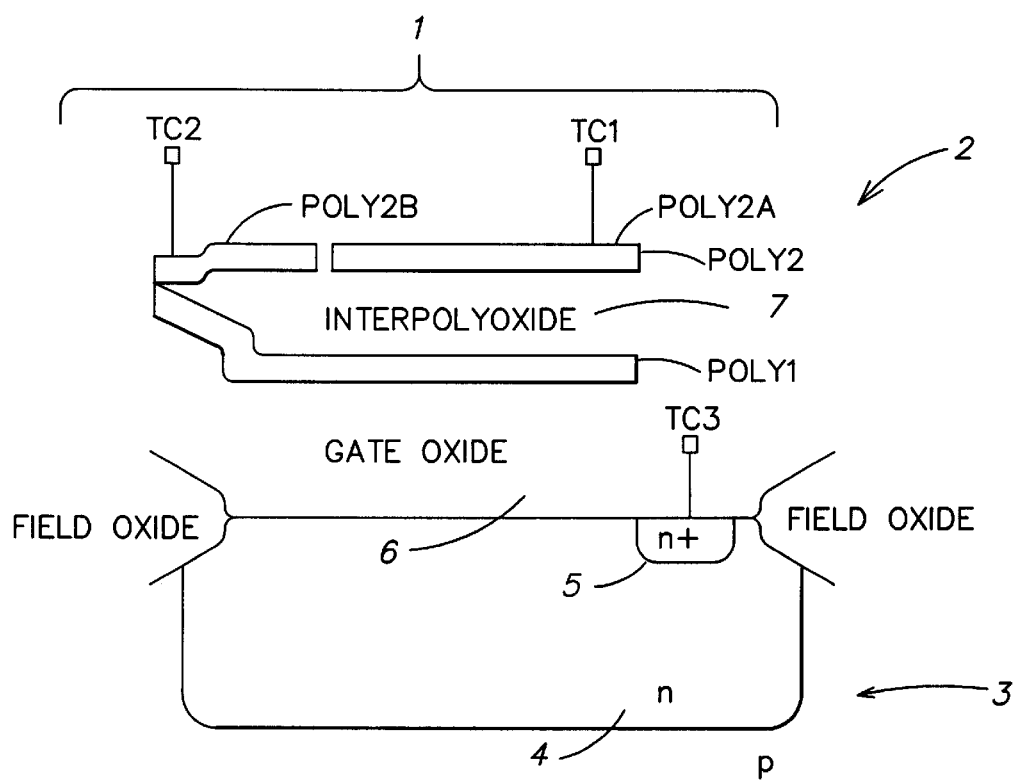
FIG. 1A shows a vertical cross-section view of a high-capacitance capacitor according to a modified embodiment of the invention.

In contrast to a first embodiment shown in FIG. 1, FIG. 1A shows a modified embodiment of the integrated structure 2 on which the high-capacitance capacitor 1 of the invention is formed. In this modification, the second layer POLY2 has first POLY2A and second POLY2B layer portions which are structurally independent and isolated from each other.

The first portion POLY2A has a first contact terminal TC1.

Advantageously, the second portion POLY2B is in direct contact with the first layer POLY1 of polycrystalline silicon and includes a second contact terminal TC2. Thus, only the second polysilicon layer will be subjected to the metallization which leads to the formation of the contact terminals for the capacitor 1.

The second contact terminal TC2 is, therefore, separated from the first contact terminal TC1.

By contrast, in the first embodiment shown in FIG. 1, the first layer POLY1 of polycrystalline silicon does not contact the second layer POLY2 which has the first contact terminal TC1 only. In this case, the contact metallization is carried out directly on the first layer of polycrystalline silicon, on either the active or the field oxide.

This contact metallization can be carried out by contact making techniques which use metals or alloys of the kind of Al, Al/Si, Al/Si/Cu, or by barrier or plug techniques, well known to those skilled in the art. The use of the DPCC process would be of particular advantage here.

Lastly, the diffused region 5 has a third contact terminal TC3. This region represents an active area of the semiconductor device to be obtained by an increased concentration of N or P dopant. However, for storage or reversal operated capacitors, N-wells or P-wells would also be workable.

Thus, the integrated structure 2 looks like a double capacitor including a first C1 and a second C2 elementary capacitor. In particular, as shown in FIG. 1A, a first elementary capacitor C1 is formed from the layers POLY1 and POLY2A which provide the conductive plates, and from the layer 7 of interpoly dielectric providing the dielectric between the plates. Furthermore, as shown in FIG. 1A, a second elementary capacitor C2 is formed from the first layer POLY1 and the diffusion well 4 which provide the conductive plates, and from the gate oxide layer 6 providing the dielectric between the plates.

The overall capacitance of the resultant capacitor is given by, $$C = C_1 + C_2 = \frac{\varepsilon_1 A_1}{T_1} + \frac{\varepsilon_2 A_2}{t_2} \qquad (1)$$

where:
$\varepsilon_1$ is the value of the dielectric constant of the interpoly dielectric layer 7 which forms the isolation dielectric of the first elementary capacitor C1;
$t_1$ is the thickness of the interpoly dielectric layer 7;
$A_1$ is the overlap area of the first and second layers of polycrystalline silicon which form the conductive plates of the first elementary capacitor C1;
$\varepsilon_2$ is the value of the dielectric constant of the gate oxide layer 6 which forms the isolation dielectric of the second elementary capacitor C2;
$t_2$ is the thickness of the gate oxide layer 6; and
$A_2$ is the overlap area of the first polycrystalline silicon layer and the diffusion well 4, which form the conductive plates of the second elementary capacitor C2.

For simplicity, it is reasonable to assume identical overlap areas and dielectric constants, i.e., that $A_1=A_2=A$ and $\varepsilon_1=\varepsilon_2=\varepsilon$, so that equation (1) becomes:

$$C = \varepsilon A \left[\frac{1}{t_1} + \frac{1}{t_2}\right] = \varepsilon A \left[\frac{t_1 + t_2}{t_1 t_2}\right] \qquad (2)$$

And assuming, for simplicity, that $t_2=kt_1$, equation (2) reduces to:

$$C = \frac{\varepsilon A}{t_1}\left[\frac{1+k}{k}\right] = \frac{\varepsilon A}{t_1}\left[1 + \frac{1}{k}\right] \qquad (3)$$

It can be seen at once from equation (3) that the overall capacitance of the capacitor 1 grows as a function of the parameter k, compared to a conventional capacitor with the same overlap area A, thickness $t_1$ of the dielectric, and dielectric constant $\varepsilon$.

With k=1, for example, a capacitance is obtained which is twice that of a capacitor having a single dielectric layer, while occupying the same area; thus, the efficiency of the structure is doubled by a high-capacitance capacitor according to the invention.

Since k is positive, the high-capacitance capacitor of this invention will always exhibit, for a given occupied area on the integrated circuit, a higher capacitance value than that of conventional capacitors. It is further apparent, from equation (3), that the capacitance of the inventive capacitor increases as k becomes smaller.

Figure 1B:
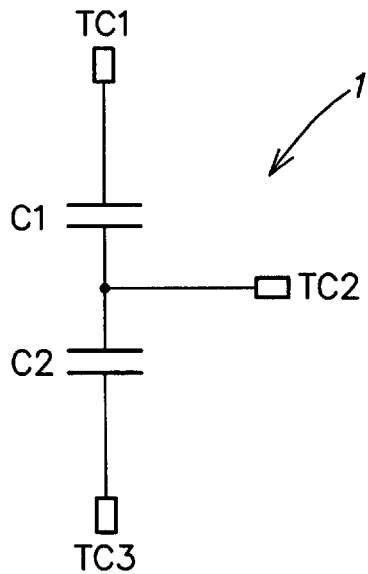
FIG. 1B is an equivalent electrical diagram of the high-capacitance capacitor of FIG. 1A, in a series layout.

Shown in FIG. 1B is the circuit equivalent of the resulting high-capacitance capacitor 1, in a series layout. The presence of three contact terminals also facilitates a parallel connection of the elementary capacitors C1 and C2. In particular, to obtain the parallel layout of FIG. 1C, it will be sufficient that the contact terminals TC1 and TC3 be shorted by placing the first portion POLY2A of the second layer of polycrystalline silicon in direct contact with the semiconductor substrate 3.

Furthermore, the integrated structure 2 affords considerable savings in space, for a given capacitive value, compared to conventional capacitors formed by utilizing the diffusion well of N+ type alone.

Figure 1C:
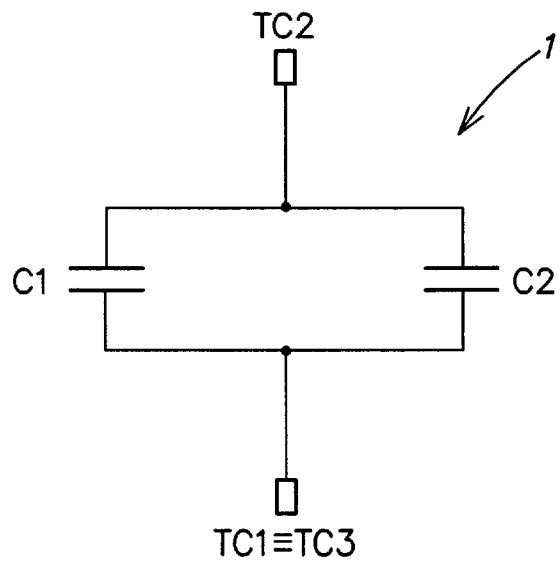
FIG. 1C is an equivalent electrical diagram of the high-capacitance capacitor of FIG. 1A, in a parallel layout.

Particularly advantageous, in terms of occupied area, is the parallel layout of the high-capacitance capacitor 1 shown in FIG. 1C. Actual tests carried out by the Applicant have shown that a saving in semiconductor area of about 35% can be obtained with this capacitor over conventional constructions.

The high-capacitance capacitor of this invention can be used to produce a voltage step-up circuit of the charge pump type.

Figure 2:
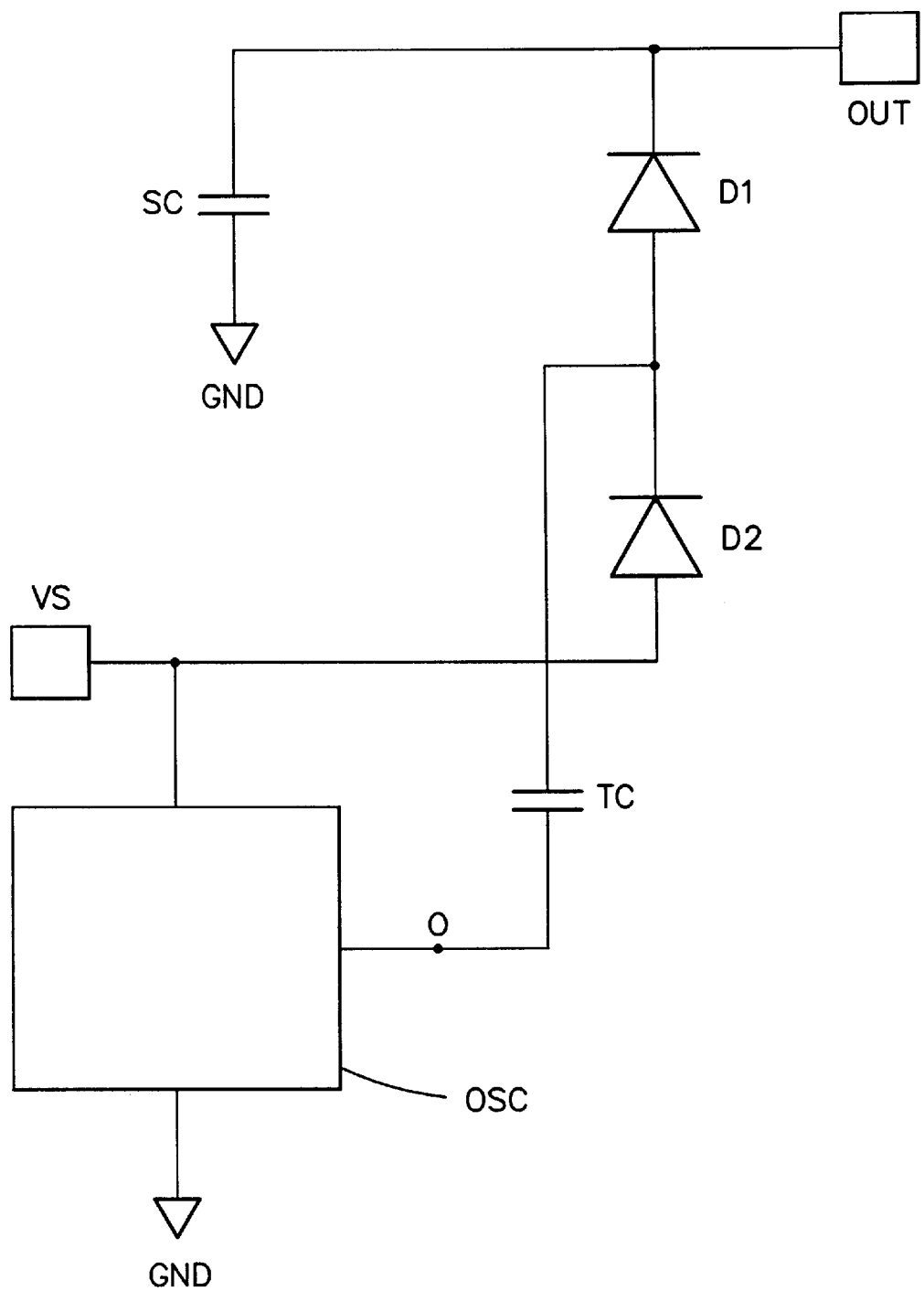
FIG. 2 shows a voltage step-up circuit of the charge pump type using high-capacitance capacitors according to an embodiment of the invention.

A well-known construction for such a voltage step-up circuit is shown in FIG. 2. The step-up circuit includes an oscillator OSC, which is; typically a square-wave oscillator, connected between a first DC supply voltage reference VS and a second voltage reference, specifically a ground voltage reference GND.

The oscillator OSC has an output terminal 01 connected to a first terminal of a capacitor TC. In particular, the capacitor TC serves a charge transfer function.

A second terminal of the capacitor TC is connected to the cathode of a diode D2 having its node connected to the supply voltage reference VS.

The cathode of the diode D2 is also connected to the anode of another diode D1 having its cathode connected to an output OUT of the voltage step-up circuit and to a terminal of a further charge storage capacitor SC, in turn connected to the ground reference GND.

In this circuit, the output (no-load) voltage is approximately twice as high as the supply voltage.

Advantageously, the charge transfer TC and charge storage SC capacitors are formed from an integrated structure 2 according to the invention.

In particular, a parallel type of connection of the high-capacitance capacitor 1 is utilized, as shown in FIG. 1C, in the voltage step-up circuit of FIG. 2.

In this way, the size of this simple circuit, containing only two high-capacitance capacitors, can be greatly reduced.

To summarize, the high-capacitance capacitor of this invention has reduced integration area requirements, and accordingly, allows the overall size of devices containing it to be reduced.

In addition, by making three contact terminals available, the change from a series layout to a parallel layout to meet contingent requirements has been facilitated.

Finally, in the first embodiment described, the metallization step for making the contact terminals of the high-capacitance capacitor according to this invention only affects the second layer POLY2 of polycrystalline silicon.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A high-capacitance capacitor which can be integrated monolithically on a semiconductor substrate doped with a first type of dopant, the high-capacitance capacitor comprising:

a first diffusion well contained within the substrate, the diffusion well being doped with a second type of dopant and formed with a first active region therein;

a gate oxide layer being deposited onto the diffusion well;

a first layer of polycrystalline silicon that covers the gate oxide layer;

a second layer of polycrystalline silicon; and a dielectric layer that separates the first and second layers of polycrystalline silicon, wherein the first and second layers of polycrystalline silicon form conductive plates of a first elementary capacitor, wherein the dielectric layer forms an isolation dielectric of the first elementary capacitor, wherein the first layer of polycrystalline silicon and the first diffusion well form conductive plates of a second elementary capacitor, and wherein the gate oxide layer forms an isolation dielectric of the second elementary capacitor;

wherein the first layer of polycrystalline silicon includes a first contact terminal of the high-capacitance capacitor, wherein the second layer of polycrystalline silicon includes a second contact terminal of the high-capacitance capacitor, and wherein the active region includes a third contact terminal of the high-capacitance capacitor;

wherein the second layer of polycrystalline silicon includes a first portion and a second portion which are structurally independent and separated from each other.

2. The high-capacitance capacitor of claim 1, wherein the first layer of polycrystalline silicon and the first portion of the second layer of polycrystalline silicon are in direct contact with each other.

3. The high-capacitance capacitor of claim 1, wherein the active region is a diffused region having a higher concentration of dopant of the second type than that of the first diffusion well.

4. The high-capacitance capacitor of claim 1, wherein the active region is a second diffusion well having a higher concentration of dopant of the second type than that of the first diffusion well.

5. A high-capacitance capacitor which can be integrated monolithically on a semiconductor substrate doped with a first type of dopant, the high-capacitance capacitor comprising:

a first diffusion well contained within the substrate, the diffusion well being doped with a second type of dopant and formed with a first active region therein;

a gate oxide layer being deposited onto the diffusion well;

a first layer of polycrystalline silicon that covers the gate oxide layer;

a second layer of polycrystalline silicon; and a dielectric layer that separates the first and second layers of polycrystalline silicon, wherein the first and second layers of polycrystalline silicon form conductive plates of a first elementary capacitor, wherein the dielectric layer forms an isolation dielectric of the first elementary capacitor, wherein the first layer of polycrystalline silicon and the first diffusion well form conductive plates of a second elementary capacitor, and wherein the gate oxide layer forms an isolation dielectric of the second elementary capacitor;

wherein the first layer of polycrystalline silicon includes a first contact terminal of the high-capacitance capacitor, wherein the second layer of polycrystalline silicon includes a second contact terminal of the high-capacitance capacitor, and wherein the active region includes a third contact terminal of the high-capacitance capacitor;

wherein the first contact terminal and the third contact terminal are shorted together.

6. A voltage step-up circuit of the charge pump type connected between a first DC supply voltage reference and a second ground voltage reference, the voltage step-up circuit comprising:

an oscillator;

an output terminal;

at least a first charge transfer capacitor connected between the oscillator and an output terminal, the first charge transfer capacitor being a high-capacitance capacitor formed a semiconductor substrate doped with a first type of dopant, the high-capacitance capacitor having:
- a diffusion well contained within the substrate, the diffusion well being doped with a second type of dopant and formed with a first active region therein;
- a gate oxide layer being deposited onto the diffusion well;
- a first layer of polycrystalline silicon that covers the gate oxide layer;
- a second layer of polycrystalline silicon; and a dielectric layer that separates the first and second layers of polycrystalline silicon, wherein the first and second layers of polycrystalline silicon form conductive plates of a first elementary capacitor, wherein the dielectric layer forms an isolation dielectric of the first elementary capacitor, wherein the first layer of polycrystalline silicon and the diffusion well form conductive plates of a second elementary capacitor, and wherein the gate oxide layer forms an isolation dielectric of the second elementary capacitor;

wherein the first layer of polycrystalline silicon includes a first contact terminal of the high-capacitance capacitor, wherein the second layer of polycrystalline silicon includes a second contact terminal of the high-capacitance capacitor, and wherein the active region includes a third contact terminal of the high-capacitance capacitor;

wherein the second layer of polycrystalline silicon includes a first portion and a second portion which are structurally independent and separated from each other.

7. The voltage step-up circuit of claim 6, further comprising:
a second charge storage capacitor connected between the ground voltage reference and the output terminal of the voltage step-up circuit, the second charge storage capacitor being another high-capacitance capacitor.

8. A high-capacitance capacitor formed in a substrate, the high-capacitance capacitor comprising:
- a region formed within the substrate;
- a first insulating layer contacting the region;
- a first conductive layer contacting the first insulating layer;
- a second insulating layer contacting the first conductive layer; and
- a second conductive layer contacting the second insulating layer, wherein the region and the first conductive layer are separated by the first insulating layer such that a first elementary capacitor is formed, and wherein the first conductive layer and at least a first portion of the second conductive layer are separated by the second insulating layer such that a second elementary capacitor is formed;

wherein the region is a diffusion well contained within the substrate, wherein the diffusion well includes an active area and a second area, and wherein the active area has a doping concentration higher than that of the second area;

further comprising a connecting path that contacts both the active area and the second conductive layer such that the first and second elementary capacitors are electrically connected in parallel.

9. The high-capacitance capacitor of claim 8, wherein the second conductive layer includes the first portion and a second portion that are electrically separated from each other.

10. The high-capacitance capacitor of claim 9, wherein the second portion of the second conductive layer contacts the first conductive layer.

11. The high-capacitance capacitor of claim 8, wherein each of the first and second insulating layers is an oxide layer.

12. The high-capacitance capacitor of claim 8, wherein each of the first and second conductive layers is a polycrystalline silicon layer.

13. A voltage step-up circuit for providing a step-up voltage at an output terminal, the voltage step-up circuit being connected between a first voltage reference terminal and a second voltage reference terminal, the voltage step-up circuit comprising:
- an oscillator;
- a first step-up capacitor coupled between the oscillator and the output terminal; and
- a second step-up capacitor coupled between the output terminal and one of the first and second voltage reference terminals, wherein at least one of the first step-up capacitor and the second step-up capacitor is a high-capacitance capacitor formed in a substrate, the high-capacitance capacitor having:
  - a region formed within the substrate;
  - a first insulating layer contacting the region;
  - a first conductive layer contacting the first insulating layer;
  - a second insulating layer contacting the first conductive layer; and
  - a second conductive layer contacting the second insulating layer, wherein the region and the first conductive layer are separated by the first insulating layer such that a first elementary capacitor is formed, and wherein the first conductive layer and at least a first portion of the second conductive layer are separated by the second insulating layer such that a second elementary capacitor is formed;

wherein the region is a diffusion well contained within the substrate, wherein the diffusion well includes an active area and a second area, and wherein the active area has a doping concentration higher than that of the second area;

further comprising a connecting path that contacts both the active area and the second conductive layer such that the first and second elementary capacitors are electrically connected in parallel.

* * * * *

UNITED STATES PATENT AND TRADEMARK OFFICE
CERTIFICATE OF CORRECTION

PATENT NO. : 6,222,245 B1
DATED : April 24, 2001
INVENTOR(S) : Roberto Bez and Emilio Camerlenghi It is certified that error appears in the above-identified patent and that said Letters Patent is hereby corrected as shown below:

Column 4,
Lines 2 and 3, equation (1) should read as follows:

$$-- \ C = C_1 + C_2 = \frac{\varepsilon_1 A_1}{t_1} + \frac{\varepsilon_2 A_2}{t_2} \ --\ .$$

Signed and Sealed this

Twelfth Day of March, 2002

Attest:

Attesting Officer

JAMES E. ROGAN
Director of the United States Patent and Trademark Office